United States Patent Office 3,108,359
Patented Oct. 29, 1963

3,108,359
METHOD FOR FABRICATING TRANSISTORS

Gordon E. Moore and Robert N. Noyce, Los Altos, Calif., assignors, by mesne assignments, to Fairchild Camera and Instrument Corporation, Syosset, N.Y., a corporation of Delaware No Drawing. Filed June 30, 1959, Ser. No. 823,838
12 Claims. (Cl. 29—25.3)

This invention relates to the fabrication of diffused-junction semiconductor devices, particularly double-diffused junction transistors, and has for its object the improvement of methods for fabricating such devices, to provide greater precision and control, manufacturing economy, and superior products.

The fabrication of high-frequency switching transistors, and the like, presents severe problems in the precise control of impurity levels and distributions, dimensional tolerances, and the maintenance of registration during successive steps in the process. For example, transistors now in large-scale commercial production by the method herein disclosed require the formation of emitter layers only 15 mils in diameter and 3.9 microns deep, above a base layer only 2.3 microns wide, at the top of a mesa 30 mils in diameter and 10 to 20 microns high, on a bit of silicon crystal having a thickness of only 60 microns. Some developmental transistors have even smaller dimensions—e.g., emitter layers only one mil in diameter. Contacts must be alloyed to each layer and leads attached, all with precisely controlled geometry and purity in order that transistors of consistent and reproducible characteristics should be obtained.

A particularly difficult problem arises in the formation and alloying of the emitter and base contacts. To minimize spreading resistance, the contacts should be as large as is feasible, but they must not short across the emitter junction. In a typical desirable configuration the emitter contact is a metalized dot, say 10 mils in diameter, centered on top of the emitter layer, and the base contact is a circular, metalized band, say 20 mils in inside diameter, concentric with the emitter dot. Thus, the base contact forms a metal barrier completely surrounding the edge of the emitter junction at the crystal surface. It has been found that this geometry greatly reduces the incidence of collector-to-emitter shorts. However, the deposition of such a small dot exactly concentric with such a small circular band, and both exactly placed relative to the small emitter junction, presents registration and other problems which are not easily solved, particularly where the base and emitter contacts are of different metals as has been generally necessary prior to the present invention if ohmic, or non-rectifying, contacts are to be made to both layers.

According to prior-art methods, as many as three successive evaporations through masks of various shapes were required to deposit contacts in the configuration described, and registration difficulties tended to reduce manufacturing economy and to increase the proportion of transistors which must be rejected as faulty. Furthermore, the use of different metals for the emitter and base contacts complicates the attachment of leads thereto, because different types of leads or different bonding techinques, or both, may be required.

The chief difficulty in using the same metal for emitter and base contacts is that suitable metals tend to act as P-type or N-type impurities in the semiconductor crystal. For example, in most respects aluminum is a very suitable contact material, markedly superior to silver, for use in the manufacture of silicon transistors. Since the aluminum forms a P-type impurity in the silicon, aluminum is easily alloyed to a P-type layer and forms a good, ohmic contact therewith. But, if aluminum is alloyed to an N-type layer, there is a tendency to form a P-type recrystallization layer immediately under the contact, which in effect adds an unwanted P-N junction and makes the contact a rectifying one rather than an ohmic one. This is why it has been the general practice heretofore to use different metals or alloys for the emitter and base contacts. Alloys incorporating N-type impurities can solve the difficulties with respect to the N-type layer, but the same difficulty then arises in the P-type layer if the same alloy is used for both emitter and base contacts.

Furthermore, in prior processes more than one evaporation may be required for depositing certain metals in a single pattern. For example, in evaporating through an ordinary mask, such as a sheet of metal into which holes have been etched corresponding to the desired contact areas, it is not possible to deposit a complete, circular band of metal, or O-shaped contact, in one operation, because the O-shaped hole in the mask must be broken at some point to provide a support for the dot that makes the center of the O. Hence, two separate evaporations have usually been required to form an O-shaped contact, which not only involves an extra process step in itself, but also presents additional registration problems which can be severe in view of the smallness of the dimensions and tolerances involved.

According to one aspect of the present invention, the same metal, preferably aluminum, is used for both emitter and base contacts. Ohmic contact between the contact metal and the semiconductor layer of opposite conductivity type is achieved by a combination of two effects: neutralization of the undesired impurities by an excess of those of opposite conductivity type; and substantial elimination of the regrowth layer under the contacts by control of the alloying procedure.

To neutralize undesired impurities by an excess of those of opposite conductivity type, two considerations are of importance: first, the difficult-contact problem should if possible be confined to the semiconductor layer having the greatest impurity concentration, usually the emitter; and, second, the contact metal should have a relatively low solubility in the semi-conductor material. For example, in an N-P-N silicon transistor, pure aluminum may be chosen as the material for making emitter and base contacts. Because the aluminum acts as a P-type impurity, no great difficulty is encountered in making an ohmic contact between the aluminum and the P-type base layer. Thus, the difficult contact problem is confined to the emitter layer, which generally has the highest impurity concentration. Furthermore, the saturation limit of aluminum in silicon is only about $10^{18}$ atoms of aluminum per cubic centimeter. Now, if the emitter layer in the region of the contact can be doped sufficiently heavily to provide a higher concentration of N-type impurities, the formation of an undesired P-type layer can be avoided. This is sometimes feasible; for example, an upper portion of the emitter layer might contain as many as $10^{20}$ atoms of phosphorus per cubic centimeter, a comfortable excess of N-type impurities, provided that recrystallization during and after alloying is restricted to this highly doped region of the emitter.

However, certain qualifications and precautions must now be observed. In diffused-junction transistors, the impurity concentration is graded rather than constant, and the alloying procedure, and in particular the depth of alloying, must be carefully controlled to limit recrystallization to regions of sufficiently high net impurity concentrations of the desired type. Also, other design considerations to achieve the desired transistor characteristics may dictate the use of lower impurity concentrations. Hence, overcompensation of undesired impurities by the use of high impurity concentrations of the desired type provides a complete solution to the problem only in a few special cases. In general, it is additionally necessary to provide an alloying procedure which substantially eliminates regrowth regions.

As initially formed, e.g., by vacuum depostion, the aluminum contact is merely a thin metal film lying on the surface of the silicon crystal, in fairly close physical contact along the interface but not securely bonded to the silicon. As a result, the contact is somewhat deficient in both mechanical and electrical characteristics. However, if the aluminum is melted some of the silicon will dissolve in the aluminum and form an alloy layer, which, upon cooling and resolidification, securely bonds the aluminum film to the silicon crystal and greatly enhances the mechanical and electrical characteristics of the contact. The problem is that there is also a tendency to form, immediately below the layer of silicon dissolved in aluminum, or alpha aluminum, a liquid layer of aluminum dissolved in silicon, or beta silicon. Upon cooling, this beta silicon recrystallizes upon the original crystalline material and forms a P-type layer between the original crystal and the alloyed contact. If the original material was initially of P-type conductivity there is no problem, and a good ohmic contact is obtained. However, if the original material was of N-type conductivity, an unwanted P-N junction may form, and a rectifying contact rather than the desired ohmic contact will result.

According to one aspect of the present invention, formation of the regrowth layer and the unwanted P-N junction is substantially eliminated by continuous, fairly rapid heating to an alloying temperature between the aluminum-silicon eutectic temperature, 577° C., and the melting point of pure aluminum, 660° C. The preferred temperature is 600° C., only slightly above the eutectic temperature. At this temperature, a liquid mixture of aluminum and silicon forms along the aluminum-silicon interface. This liquid consists principally of aluminum containing a small proportion of dissolved silicon, because the silicon goes into solution relatively slowly. The alloying temperature is maintained just long enough to form sufficient alloy for good mechanical and electrical bonding of the silicon and aluminum—that is, just long enough for the interface to reach substantially the alloying temperature specified. The structure is then cooled promptly, and little if any regrowth into beta silicon occurs. In any event, the amount of beta silicon formed is insufficient to produce a continuous layer between the original crystalline material and the alloyed contact, so that there is adequate ohmic contact between the aluminum and the original crystalline layer, and any small local P-N junction, which may exist where specks of beta silicon occur, are effectively shorted and cause no particular difficulty.

The remaining problems of minimizing the number of process steps, achieving greater precision and control with respect to impurity distributions, junction and contact geometries, dimensions, and tolerances, manufacturing economy, greater freedom of design, particularly with respect to feasible geometries for economical manufacture, and the production of superior products, are achieved by combining the above-described procedure for contact formation into a complete fabrication process making maximum use of advanced diffusion and photoengraving techniques.

In brief, wafers of single-crystal semiconductor material, e.g., silicon, are oxidized to form a surface oxide film and the base-layer impurity is diffused into the wafer surface. Next, the oxide film over the emitter areas is removed by photoengraving, and the emitter-layer impurity is diffused into the wafer, using the oxide film as a mask, whereby the emitter layers take the form of small islands on the wafers, while around these islands the base layer comes to the surface so that contacts may be readily attached thereto. The wafers are now deoxided, and the front (emitter-side) surface is metallized—e.g., by vacuum deposition of an aluminum film. Photoengraving is again used, to remove the unwanted metal and simultaneously form both the emitter and base contacts.

The emitter and base contacts are alloyed to the silicon in an inert atmosphere, by inserting the wafers into a furnace maintained at a temperature between the aluminum-silicon eutectic temperature and the melting point of aluminum, e.g., in a furnace maintained at 600° C., for a brief period, e.g., five minutes, just sufficient for adequate alloying of the aluminum contacts to the silicon. The wafers are then promptly withdrawn to a cool part of the furnace, still in the inert atmosphere, and allowed to cool before any substantial formation of recrystallized beta silicon occurs. The back sides of the wafers are then lapped to final wafer thickness and metallized, mesas are etched on the front sides of the wafers, the wafers are diced to separate the individual transistors, leads are attached, and the transistors are mounted, baked, and encapsulated.

For a better understanding of the invention, two examples will be described in considerable detail. Example I is the fabrication of a typical, N-P-N, double-diffused, silicon, switching transistor; and Example II is the fabrication of a typical, P-N-P, double-diffused, silicon, switching transistor.

EXAMPLE I

*Step 1.—Wafer Preparation*

Lapped wafers, about 200 microns thick, of N-type silicon having a resistivity of 1 to 1.4 ohm centimeters, are cleaned and chemically etched to a thickness of 120 microns to produce a microscopically smooth, substantially undamaged crystal surface.

*Step 2.—Base Formation*

(*a*) Surface oxidation and base diffusion are performed in a quartz-tube type diffusion furnace maintained at 1200° C. The silicon wafers are placed flat on a quartz boat and inserted into the high-temperature zone of the furnace. A flow of 100 cc./minute of dry oxygen is passed through the furnace for 16 hours, which builds up on the wafer surface an oxide layer somewhat over 1.0 micron thick.

(*b*) High-purity $Ga_2O_3$ is placed in a source boat adjacent to the wafer boat, within the 1200° C. high-temperature region of the furnace. The gallium source need not be removed from the furnace during oxidation of the wafers, because no deposition takes place until a reducing atmosphere of hydrogen is introdced.

After surface oxidation of the wafers is completed, the oxygen flow is cut off and oxygen is flushed from the furnace with a flow of about 500 cc./minute of dry nitrogen for about five minutes. Then the nitrogen flow rate is reduced to 90 cc./minute, and dry hydrogen is introduced at a flow rate of 10 cc./minute. The gas mixture is critical, and the flow rates should be set carefully.

In the presence of hydrogen, gallium from the source is deposited on the surfaces of the silicon wafers, and diffuses through the oxide into the silicon. In fact, the oxide appears to have no appreciable effect upon the gallium concentration at the surface of the silicon. Since the surface concentration of gallium is maintained substantially constant during diffusion (constant deposition of gallium from the source onto the wafer surfaces), the distribution of diffusant versus depth into the silicon has the form of a complementary error function.

The usual diffusion time is 30 minutes. The hydrogen is turned off after it has been flowing for 27 minutes, and the furnace tube is then flushed with nitrogen for 3 minutes. Test wafers should now give a *V/I* reading of 30±2 ohms, and have a junction depth of 3.5 microns.

*Step 3.—Emitter Formation*

(*a*) The oxide layer, built up during base formation, is removed from the emitter areas by photoengraving methods, and remains over other areas as a mask that is impervious to the emitter diffusant, phosphorus. A photoengraving resist, e. g., Kodak Photo Resist (KPR) sold by Eastman Kodak Company and well known in the photoengraving art, is applied directly to the wafers and the wafers are spun to remove the excess.

A master photographic plate, made by photographic reduction from large-scale drawings, has opaque areas corresponding to the desired emitter areas of the silicon wafers. In the example under discussion, wherein 100 transistors are to be made from each wafer, the pattern of emitter areas consist of a 10 x 10 array of dots, each 15 mils in diameter, spaced on a $\frac{1}{15}$ inch module. Hence, the master plate is formed with a similar array of opaque dots, each 15 mils in diameter. Each wafer, in turn, is placed face (emitter side) down on the emulsion side of the master plate in an indexing jig, and is exposed for one minute from an H-4 mercury arc approximately five inches on the other side of the master plate. The exposed wafers are soaked in the usual developer for two minutes, which dissolves off the unexposed areas of the resist film (dots on the emitter side, and the entire film on the back side of the wafer). Then the resist film is dried and baked in accordance with conventional photoengraving practice.

Next, the wafers are etched, e.g., for 30 minutes at 17° C. in a HF, $NH_4F$ etching solution to remove the oxide layer from the emitter areas on the face of each wafer, and from the entire back sides of the wafers. After etching, the remaining resist film is softened by soaking in an organic solvent, e.g., acetone, and then is scrubbed off.

(*b*) The predeposition method of emitter diffusion is employed, which produces a Gaussian distribution of diffusant versus depth into the wafer. Predeposition is accomplished in a quartz-tube furnace having a source region maintained at 200° C. and a high-temperature region maintained at 1000° C. A source boat filled with $P_2O_5$ is inserted into the 200° C. region, and a flow of 200 cc./minute of dry hydrogen is maintained through the furnace. Subsequently, the photoetched silicon wafers are laid flat on a quartz boat and are inserted into the high-temperature region for 50 minutes. During this time phosphorus is deposited on the silicon surfaces that are not masked by the oxide film. The temperature is not high enough for rapid diffusion into the wafers to take place.

The wafers are then removed from the furnace, nickel plated on their back sides, and rinsed. The nickel acts as a getter for undesired impurities during the subsequent diffusion steps, and markedly improves the quality of the transistors.

(*c*) Diffusion is accomplished at a temperature too high for completely effective oxide masking of phosphorus, but in a furnace containing no phosphorus source, so that the diffusant is restricted to regions near the predeposited surface concentrations. The wafers are placed flat on a quartz boat, and inserted ino a quartz-tube type diffusion furnace maintained at 1108° C. An oxygen flow of 200 cc./minute is maintained through the furnace. The oxygen atmosphere oxidizes the exposed silicon surfaces and prevents out-diffusion of the phosphorus. Some gallium is lost by out-diffusion. Diffusion is completed in 45 minutes and the wafers are then removed from the diffusion furnace.

The emitter junction should now be at a depth of 2.6 microns and the collector junction at a depth of 4.8 microns within the wafer. The emitter layers are in the form of 100 small islands or dots, each substantially 15 mils in diameter. Elsewhere in the wafer, the base layer extends to the surface, and thus surrounds each of the emitter dots.

*Step 4.—Contact Formation*

(*a*) The wafers are deoxidized in HF and then rinsed in methyl alcohol. Next, the front (emitter) surface is metallized, preferably by vacuum coating with pure aluminum. This may be done in a standard, bell-jar evaporator, with the aluminum heated to 2000° C. for 30 seconds in a helical tungsten filament about 4 centimeters from the front surface of the wafer. In this process, it is to be noted that the same metal is coated onto exposed portions of both the emitter layer and the base layer.

(*b*) Unwanted metal is then removed by photoengraving, using the same method as in Step 3(*a*) described above. The only substantial differences are that the master plates employed are of different patterns, and different etching solutions are used.

As previously explained, the master plate used for emitter etching has an array of opaque dots which prevent exposure of the resist over the emitter areas, so that the resist and the underlying oxide will be removed during subsequent developing and etching operations from the array of islands or dots that are to become emitters. The master plate used for photoengraving the contacts must have an array of transparent figures corresponding to the desired contact configurations, and be opaque elsewhere so that the resist will remain over the desired contact areas and allow the unwanted metal elsewhere to be etched off. A typical contact figure consists of a small dot, 10 mils in diameter, substantially centered within each emitter dot for making contact with the emitter layer, and a circular band, of 20 mils inside diameter, concentric with the emitter dots for making contact with the base layer.

It is evident that the module spacings of the emitter and contact master plates must correspond with great precision, and that the wafers must be accurately indexed on the master plates for each exposure. Indexing is accomplished by permanently mounting the master plates in frames provided with 3-point jigs that make contact with two edges of the silicon wafer. After the exposed resist has been developed, dried and baked, the unwanted aluminum is removed by etching in a 25% solution of NaOH.

(*c*) After the unwanted metal has been removed, the contacts are alloyed to the silicon in an argon atmosphere. A quartz-tube type of diffusion furnace is set at 600° C., and is thoroughly flushed with argon. The wafers are laid flat on a quartz boat and inserted directly into the hot zone for about five minutes. At the end of this time they are withdrawn rapidly to a cool portion of the furnace where they remain in the argon atmosphere until cool, about five minutes. When alloyed in this manner, it is found that the aluminum makes a good ohmic contact, not only to the P-type base layer, but to the N-type emitter layer as well.

*Step 5.—Fabrication Completion*

Each wafer now has formed therein 100 double-diffused junction transistors, complete with front-side contacts alloyed to the base and emitter layers. Fabrication into individual transistors is completed by substantially conventional means. The back sides of the wafers are lapped to a final wafer thickness of 60 microns, cleaned and metallized, e.g., by nickel plating. Wax dots are deposited on the front side through a glass screen which has been photoetched with the correct pattern to mask the emitter and base areas of each transistor. The wafers are then etched for mesas, about 10 to 20 microns high. Next, the wafers are diced to separate the individual transistors, and leads are attached, preferably by thermal-compression bonding to the emitter and base contacts. The metallized back side of the transistor is soldered to a header, the so-mounted devices are washed, vacuum baked, and welded into a metal envelope.

EXAMPLE II

*Step 1.—Wafer Preparation*

Lapped wafers, about 200 microns thick, of P-type silicon having a resistivity of 0.7 to 1.3 ohm centimeters, are cleaned and chemically etched to a thickness of 120 microns to produce a microscopically smooth, substantially undamaged crystal surface.

*Step 2.—Base Formation*

(*a*) Antimony is diffused into the wafer surfaces by the predeposition method, carried out in a quartz-tube furnace with two temperature zones: a vaporizing zone heated by a small, preheater furnace maintained at a temperature of 605° C., and a diffusion zone heated by the main furnace to a temperature of 1120° C. $Sb_2O_3$ is vaporized from a source boat by the preheater furnace, and a flow of 250 cc./minute of dry nitrogen is maintained through the tube. After 25 minutes the source boat is removed, the temperature in the main furnace is raised to 1205° C., and the gas flow is switched to 250 cc./minute of dry oxygen. Diffusion for 15½ hours yields a surface concentration of $3\times10^{18}$ atoms of antimony per cc., a junction depth of 6.3±0.2 microns, and a $V/I$ reading of 8±1 ohm. During diffusion a thick layer of oxide, greater than one micron thick, builds upon the wafer surfaces.

*Step 3.—Emitter Formation*

(*a*) The oxide layer, built up during base formation, is removed from the emitter areas by photoengraving methods, as described in Step 3(*a*) of Example I.

(*b*) The predeposition method of emitter diffusion is employed. Predeposition is accomplished in a quartz-tube furnace set up at a temperature of 1230° C. A steady flow of 400 cc./minute of nitrogen and 3 cc./minute of oxygen is maintained through the furnace for at least 5 minutes before the introduction of wafers.

The silicon wafers are given a dip in HF followed by thorough rinsing to remove any residual oxide on the emitter dots. The wafers are dried, placed upright on a quartz-boat, and inserted into the high-temperature zone of the furnace. One minute later, an additional flow of 15 cc./minute of hydrogen is set up through the quartz tube. The small amounts of oxygen and hydrogen added to the flow of nitrogen during predeposition makes feasible the use of $BCl_3$ (gaseous at room temperature) as a boron source, by eliminating erosion of the silicon due to attack by chlorine. It is believed that a very thin oxide layer built up by oxygen protects the silicon surface against direct contact by the chlorine, and that the hydrogen serves several functions: it fixes the chlorine, and it partially recombines with oxygen to give water vapor and further oxidation, and it makes the so-created oxide layer pervious to boron. The flow rates of the added gases are critical since excess amounts tend to lower the doping level and to impair the masking effect of the relatively thick oxide film covering the base-contact areas.

One minute after the flow of nitrogen is started, a flow of $BCl_3$ (same reading as the hydrogen flow on a similar sapphire-ball flow meter) is added to the gases passing through the quartz tube of the furnace. The flow of $BCl_3$ is shut off after one minute, and its conduit line is flushed with nitrogen to assure passage of the full amount of released $BCl_3$.

Three minutes after the $BCl_3$ is shut off, the hydrogen and nitrogen flows are turned off in this order, and a main flow of 400 cc./minute of oxygen is established. Three minutes later the wafers are removed from the furnace, and the main gas flow through the furnace is turned back to nitrogen.

After masking the front (emitter) side of the wafers with black wax backed with a glass side, the back side is cleaned with HF and then etched slightly to expose the subjacent N layer, lightly scratched with fine sandpaper and rinsed. The wafers are dipped into an electroless nickel-plating solution until a homogeneous nickel layer is deposited on the back sides of the wafers. The wafers are then removed from the glass slides, cleaned and dried.

The nickel acts as a getter during the subsequent diffusion procedure, as hereinbefore explained.

(*c*) The wafers are placed flat on a quartz boat and diffused in a separate furnace at a temperature of 1230° C. for 11 minutes with a flow of 400 cc./minute of oxygen through the furnace. Wafers should be removed from the hot zone slowly and cooled to about 200° C. in a uniform way over one minute. The reasons for this "fast slow cool" are as follows: It is generally established that slow cooling improves carrier lifetimes and improves the D.C. current gain of the transistor. On the other hand, the nickel does not act as an efficient getter over long diffusion periods, as is evident from the poor transistor characteristics obtained if the wafers are subjected to the conventional slow cooling over a relatively long period. The compromise "fast slow cool" here described gives the best overall results.

After boron diffusion, test wafers should yield the following values: $V/I=0.4\pm0.1$ ohm for the boron layer, with the emitter junction at a depth of 4.0±0.2 micron and the collector junction at a depth of 6.3±0.2 micron.

*Step 4.—Contact Formation*

Contacts are formed substantially as described above in Step 4 of Example I. However, in P-N-P structures the more heavily doped emitter structure is of P-type conductivity, and the less heavily doped base layer is the N-type layer which is the most difficult to alloy with aluminum without forming undesired rectifying junctions. In this case, better results have been obtained using aluminum containing some phosphorus for the contact metal, whereby the phosphorus provides additional N-type impurities to help compensate the P-type action of the aluminum itself. Also, contacts with good electrical characteristics have been produced with silver-phosphorus alloys, with about 10% aluminum evaporated underneath.

*Step 5.—Fabrication Completion*

After the emitter and base contacts have been alloyed to the silicon wafers, fabrication of the individual transistors is completed in the manner hereinbefore described in Step 5 of Example I.

It will be understood that the invention in its broader aspects is not limited to the specific examples described.

What is claimed is:

1. The method of fabricating semiconductor devices, which comprises oxidizing the surface of a wafer of semiconductor material to form an oxide film thereon, exposing islands of unoxidized semiconductor material by removing portions of said film by photoengraving, forming P-N junctions separating a surface layer of each island from the subjacent semiconductor material by depositing onto said islands a diffusant to which said film is impervious and diffusing such diffusant into said semiconductor material at an elevated temperature in an oxidizing atmosphere whereby the surface is reoxidized, deoxiding contact areas on said islands and on adjacent portions of the wafer surface, depositing a metal coating on the surface including said contact areas, and removing portions of said coating by photoengraving, leaving separate metallic contacts of the same metal on each of said islands and on the material of the opposite conductivity type adjacent to each of said islands.

2. The method as set forth in claim 1, comprising the additional steps of heating said wafer and contacts to a temperature above the eutectic temperature of said metal and said semiconductor material but below the melting point of said metal, and promptly cooling said wafer and contacts below said eutectic temperature.

3. The method of fabricating N-P-N transistors, which comprises heating a wafer of N-type silicon in an oxidizing atmosphere until an oxide film over one micron thick is formed thereon, forming a P-type base layer by diffusing gallium through said film into said wafer, subsequently exposing islands of the unoxidized silicon by removing portions of said film from one surface of said wafer by photoengraving, forming an N-type emitter layer at the surface of each island, separated by a P-N junction form the subjacent base layer, by depositing and diffusing phosphorus into said islands, the oxide film surrounding said islands acting as a mask to said phosphorus for bringing the base layer to the wafer surface around each of the emitter islands, subsequently removing any oxide that may have re-formed on said islands and also deoxiding adjacent portions of said base layer, then vacuum-depoisting a coating of aluminum on said one surface, removing portions of said coating by photoengraving, leaving a separate aluminum emitter contact on each of said islands and a separate aluminum base contact adjacent to each of said islands, subsequently heating said wafer and contacts rapidly in an inert atmosphere to an alloying temperature between 577° C. and 660° C. by placing them in a furnace set at said alloying temperature, and promptly thereafter cooling said wafers and contacts below 577° C. in an inert atmosphere, thereby alloying the aluminum contacts to the silicon without forming unwanted rectifying junctions.

4. The method as set forth in claim 3, comprising the additional step of nickel-plating the side of said wafer opposite said one surface prior to diffusion of said phosphorus into said islands.

5. The method as set forth in claim 3, wherein said aluminum is substantially pure and forms a P-type impurity in silicon.

6. The method of fabricating P-N-P transistors, which comprises depositing antimony on the surface of a wafer of P-type silicon, forming an N-type base layer by subsequently heating said wafer in an oxygen atmosphere for diffusing said antimony into the wafer, said heating concurrently forming an oxide film over one micron thick on the surface of said wafer, subsequently exposing islands of the unoxidized silicon by removing portions of said film from one surface of said wafer by photoengraving, forming a P-type emitter layer at the surface of each island, separated by a P-N junction from the subjacent base layer, by depositing and diffusing boron into said islands, the oxide film surrounding said islands acting as a mask to said boron for bringing the base layer to the wafer surface around each of the emitter islands, subsequently removing any oxide that may have re-formed on said islands and also deoxidizing adjacent portions of said base layer, then vacuum-depositing a coating of aluminum on said one surface, removing portions of said coating by photoengraving, leaving a separate aluminum emitter contact on each of said islands and a separate aluminum base contact adjacent to each of said islands, subsequently heating said wafer and contacts rapidly in an inert atmosphere to an alloying temperature between 577° C. and 660° C. by placing them in a furnace set at said alloying temperature, and promptly thereafter cooling said wafers and contacts below 577° C. in an inert atmosphere, thereby alloying the aluminum contacts to the silicon without forming unwanted rectifying junctions.

7. The method as set forth in claim 6, comprising the additional step of nickel-plating the side of said wafer opposite said one surface prior to diffusion of said boron into said islands.

8. The method as set forth in claim 6, wherein phosphorus is alloyed with said aluminum prior to its deposition on said wafer, and the alloy as a whole forms an N-type net impurity in silicon.

9. The method as set forth in claim 6, comprising the additional step of depositing a silver-phosphorus alloy over said aluminum contacts prior to alloying thereof.

10. The method of forming an ohmic, non-rectifying contact between aluminum and an N-type silicon, which comprises establishing and maintaining physical contact between said metal and said silicon along an interface therebetween, rapidly heating said interface by placing said aluminum and silicon in an inert atmosphere within a furnace region maintained at a temperature between 577° C. and 660° C., and promptly upon said interface reaching said temperature removing said aluminum and silicon to a region in an inert atmosphere maintained at a temperature subsequently below 577° C.

11. The method of forming an ohmic, non-rectifying contacts between a metal of uniform composition and a semiconductor material having both P-type and N-type conductivity regions, which comprises selecting a metal which tends to form in said semiconductor material a net impurity concentration of the same conductivity type as the one of said regions having the lowest impurity concentration, placing said metal in physical contact with said material along an interface therebetween, continuously heating said metal and said material until said interface reaches a temperature bove the eutectic temperature of said metal and said material but below the melting point of said metal, and thereafter promptly cooling said metal and said material below said eutectic temperature.

12. The method of forming an ohmic, non-rectifying contact between aluminum and an N-type semiconductor material, which comprises establishing and maintaining physical contact between said aluminum and said material along an interface therebetween, rapidly heating said interface by placing said aluminum and material in an inert atmosphere within a furnace region maintained at a temperature above the melting point of the eutectic of said aluminum and said material but below the melting point of said aluminum, and promptly upon said interface reaching said eutectic melting temperature removing said aluminum and material to a region in an inert atmosphere miantained at a temperature substantially below that of the furnace.

References Cited in the file of this patent

UNITED STATES PATENTS

| | | |
|---|---|---|
| 2,680,220 | Starr et al. | June 1, 1954 |
| 2,695,852 | Sparks | Nov. 30, 1954 |
| 2,793,420 | Johnston et al. | May 28, 1957 |
| 2,806,983 | Hall | Sept. 17, 1957 |
| 2,845,375 | Gobat et al. | July 29, 1958 |
| 2,858,489 | Henkels | Oct. 28, 1958 |
| 2,984,775 | Matlou et al. | May 16, 1961 |
| 3,025,589 | Hoerni | Mar. 20, 1962 |

OTHER REFERENCES

Biondi "Transistor Technology," vol. III, published by D. Von Nostrand Co., Inc. Copyright 1958 (pages 24–25, 94–95, 237–244 relied on).